(12) United States Patent
Maeda

(10) Patent No.: US 9,082,904 B2
(45) Date of Patent: Jul. 14, 2015

(54) SOLAR CELL MODULE AND SOLAR PHOTOVOLTAIC SYSTEM

(75) Inventor: Tsuyoshi Maeda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/388,260

(22) PCT Filed: Sep. 6, 2010

(86) PCT No.: PCT/JP2010/065244
§ 371 (c)(1),
(2), (4) Date: Jan. 31, 2012

(87) PCT Pub. No.: WO2011/033958
PCT Pub. Date: Mar. 24, 2011

(65) Prior Publication Data
US 2012/0125435 A1 May 24, 2012

(30) Foreign Application Priority Data
Sep. 18, 2009 (JP) .................................. 2009-217823

(51) Int. Cl.
*H01L 31/00* (2006.01)
*H01L 31/042* (2014.01)
*H02N 6/00* (2006.01)
(Continued)

(52) U.S. Cl.
CPC .... *H01L 31/02322* (2013.01); *H01L 31/02327* (2013.01); *H01L 31/055* (2013.01); *H01L 31/0547* (2014.12); *Y02E 10/52* (2013.01)

(58) Field of Classification Search
CPC .............. H01L 31/02322; H01L 31/0525; H01L 31/055; H01L 31/02327; Y02E 10/52
USPC ........ 136/244, 246, 247, 251, 252, 257, 259, 136/263
See application file for complete search history.

(56) References Cited

U.S. PATENT DOCUMENTS 4,140,544 A * 2/1979 Sill .............................. 136/247
4,144,097 A * 3/1979 Chambers et al. ............ 136/247
(Continued)

FOREIGN PATENT DOCUMENTS

JP 58-32476 A 2/1983
JP 61-136559 U 8/1986
(Continued)

OTHER PUBLICATIONS

U.S. Appl. No. 13/704,410.*
(Continued)

*Primary Examiner* — Jonathan Johnson
*Assistant Examiner* — Lindsey Bernier
(74) *Attorney, Agent, or Firm* — Morrison & Foerster LLP

(57) ABSTRACT

The present invention provides a solar cell module which has high design freedom and can be easily manufactured at low cost. A solar cell module (10) includes (i) a light guide plate (1), (ii) a fluorescence-dispersed film (2) in each of which a fluorescent substance is dispersed and which is adhered to respective at least one surface of the light guide plate (1), and (iii) a solar cell element (3) which is provided on another surface of the light guide plate (1) which another surface being perpendicular to the at least one surface. Therefore, it is not necessary to prepare a light guide plate in which a fluorescent substance is dispersed. Moreover, it is possible to arbitrarily pattern the fluorescence-dispersed film (2) or to stack the fluorescence-dispersed films (2).

9 Claims, 4 Drawing Sheets

(51) Int. Cl.
*H01L 31/0232* (2014.01)
*H01L 31/055* (2014.01)
*H01L 31/054* (2014.01)

(56) References Cited

U.S. PATENT DOCUMENTS

| | | | |
|---|---|---|---|
| 4,149,902 A * | 4/1979 | Mauer et al. | 136/247 |
| 4,173,495 A * | 11/1979 | Rapp et al. | 136/259 |
| 4,193,819 A * | 3/1980 | Wohlmut | 136/247 |
| 4,199,376 A * | 4/1980 | Sill | 136/247 |
| 4,324,946 A * | 4/1982 | Gravisse | 136/247 |
| 4,488,047 A | 12/1984 | Thomas | |
| 4,644,716 A | 2/1987 | Neuroth | |
| 5,714,012 A | 2/1998 | Murata et al. | |
| 6,441,551 B1 | 8/2002 | Abe et al. | |
| 8,283,560 B2 | 10/2012 | Slager | |
| 2008/0149164 A1 | 6/2008 | Goedmakers et al. | |
| 2008/0149165 A1 | 6/2008 | Hoeks et al. | |
| 2008/0223438 A1 | 9/2008 | Xiang et al. | |
| 2009/0027872 A1 | 1/2009 | Debije et al. | |
| 2009/0032083 A1 * | 2/2009 | Torrance et al. | 136/246 |
| 2009/0044861 A1 | 2/2009 | Debije et al. | |
| 2009/0199893 A1 | 8/2009 | Bita et al. | |
| 2009/0288705 A1 | 11/2009 | Hiwatashi et al. | |
| 2012/0118381 A1 * | 5/2012 | Debije et al. | 136/259 |
| 2012/0138144 A1 * | 6/2012 | Maeda | 136/257 |
| 2012/0240979 A1 * | 9/2012 | Maeda et al. | 136/247 |

FOREIGN PATENT DOCUMENTS

| | | |
|---|---|---|
| JP | 61-284972 A | 12/1986 |
| JP | 1-140587 U | 9/1989 |
| JP | 2-39577 A | 2/1990 |
| JP | 3-273686 A | 12/1991 |
| JP | 10-110670 A | 4/1998 |
| JP | 11-103087 A | 4/1999 |
| JP | 11-152868 A | 6/1999 |
| JP | 11-330525 A | 11/1999 |
| JP | 2000-155219 A | 6/2000 |
| JP | 2001-7377 A | 1/2001 |
| JP | 2001-77399 A | 3/2001 |
| JP | 2001-311564 A | 11/2001 |
| JP | 2006-78006 A | 3/2006 |
| JP | 2007-218540 A | 8/2007 |
| JP | 2008-151490 A | 7/2008 |
| JP | 2008-536953 A | 9/2008 |
| WO | 95/17015 A1 | 6/1995 |
| WO | 2009/059998 A1 | 5/2009 |
| WO | 2011/033958 A1 | 3/2011 |
| WO | 2011/061987 A | 5/2011 |
| WO | 2011/065084 A1 | 6/2011 |

OTHER PUBLICATIONS

International Search Report and Written Opinion received for PCT Patent Application No. PCT/JP2010/065244, mailed on Dec. 7, 2010, 11 pages (5 pages of English Translation and 6 pages of Search Report and Written Opinion).

International Preliminary Report on Patentability received for PCT Patent Application No. PCT/JP2010/065244, issued on Mar. 29, 2012, 9 pages (5 pages of English Translation and 4 pages of IPRP).

International Search Report received for PCT Patent Application No. PCT/JP2010/065245, mailed on Dec. 7, 2010, 5 pages (2 pages of English Translation and 3 pages of PCT Search Report).

International Search Report and Written Opinion received for PCT Patent Application No. PCT/JP2010/069160, mailed on Feb. 15, 2011, 12 pages (6 pages of English Translation and 6 pages of PCT Search Report).

International Search Report and Written Opinion received for PCT Patent Application No. PCT/JP2011/060437, mailed on May 31, 2011, 12 pages (6 pages of English Translation and 6 pages of PCT Search Report).

International Preliminary Report on Patentability received for PCT Patent Application No. PCT/JP2011/060437, issued on Januray 15, 2013, 8 pages (5 pages of English Translation and 3 pages of IPRP).

Non Final Office Action received for U.S. Appl. No. 13/514,283, mailed on Mar. 21, 2013, 13 pages.

Non-Final Office Action received for U.S. Appl. No. 13/390,211, mailed on Mar. 27, 2013, 12 pages.

Non Final Office Action received for U.S. Appl. No. 13/704,410, mailed on Apr. 3, 2013, 9 pages.

Final Office Action for U.S. Appl. No. 13/514,283 in the name of Tsuyoshi Maeda et al. Notification date: Aug. 30, 2013.

Final Office Action for U.S. Appl. No. 13/704,410 in the name of Hideomi Yui et al. Notification date: Sep. 10, 2013.

Final Office Action received for U.S. Appl. No. 13/390,211. Notification Date: Sep. 30, 2013, 18 pages.

* cited by examiner

SOLAR CELL MODULE AND SOLAR PHOTOVOLTAIC SYSTEM

CROSS REFERENCE TO RELATED APPLICATIONS

This is a U.S. National Phase patent application of PCT/JP2010/065244, filed Sep. 6, 2010, which claims priority to Japanese Patent Application No. 2009-217823, filed Sep. 18, 2009, each of which is hereby incorporated by reference in the present disclosure in its entirety.

TECHNICAL FIELD

The present invention relates to a solar cell module and a solar photovoltaic device including the solar cell module.

BACKGROUND ART

According to a conventional solar photovoltaic device, which has been used so as to efficiently utilize solar energy, solar panels are generally spread all over a plane facing the sun. Such solar panels are each configured, in general, with the use of an opaque semiconductor. Therefore, such solar panels cannot be stacked when the solar panels are used. On this account, it is necessary to employ large solar panels in order to sufficiently collect sunlight, and accordingly, an installation area of the solar panels becomes larger. Patent Literature 1 discloses, as an example of such a solar photovoltaic device, a technique in which a fluorescent material film is provided on a light-receiving surface of a solar cell module so as to increase energy efficiency of incoming sunlight.

Patent Literature 2 discloses a technique to efficiently utilize solar energy while achieving a reduction of an area of a solar panel. In the technique disclosed in Patent Literature 2, (i) a solar cell is adhered to a side face, which is perpendicular to a daylight surface, of a light absorbing/emitting plate in which a fluorescent substance is dispersed, and (ii) the light absorbing/emitting plate is used as a windowpane of a building. According to the configuration, sunlight, which has entered through the daylight surface, is guided in the light absorbing/emitting plate, and is then converged onto the solar cell.

Patent Literature 3 discloses a technique to efficiently recover solar energy. According to the technique, a solar energy recovering window, in which a solar cell is provided on an edge part of a glass substrate on which a silicon dioxide thin film containing fluorescence is deposited by a liquid phase deposition, is used in a building, an automobile, or the like.

CITATION LIST

Patent Literature

Patent Literature 1
Japanese Patent Application Publication Tokukai No. 2001-7377 A (Publication date: Jan. 12, 2001)
Patent Literature 2
Japanese Unexamined Utility Model Application Publication Jitsukaisho No. 61-136559 (Publication date: Aug. 25, 1986)
Patent Literature 3
Japanese Patent Application Publication Tokukaihei No. 3-273686 A (Publication date: Dec. 4, 1991)

SUMMARY OF INVENTION

Technical Problem

According to the technique disclosed in Patent Literature 2, it is not necessary to enlarge an area of the solar panel so as to collect sunlight, unlike the technique disclosed in Patent Literature 1. However, the manufacturing cost will be increased because a large number of plate materials containing fluorescent substances are used. Moreover, in a case where the entered light is repeatedly subjected to total reflection in the light absorbing/emitting plate, the light is to repeatedly contact with the fluorescent substance, and therefore the efficiency is declined. According to the technique disclosed in Patent Literature 3, the silicon dioxide thin film containing fluorescence is deposited on the surface of the glass substrate by the liquid phase deposition. This leads to a low design freedom, and, in a case where the film is to be repaired for a defect or is to be altered, the entire glass substrate needs to be replaced with another one.

Under the circumstances, it is demanded to develop a solar cell module which (i) achieves space saving, (ii) can be easily manufactured at lower cost, and (iii) has a high design freedom.

The present invention is accomplished in view of the problems, and its object is to provide (i) a solar cell module which has a high design freedom and can be easily manufactured at low cost, and (ii) a solar photovoltaic device including the solar cell module.

Solution to Problem

In order to attain the object, a solar cell module of the present invention includes: a light guide plate; at least one fluorescence-dispersed film in each of which a fluorescent substance is dispersed, the at least one fluorescence-dispersed film being adhered to respective at least one surface of the light guide plate; and a solar cell element which is provided on another surface of the light guide plate, the another surface being perpendicular to the at least one surface. A solar photovoltaic device of the present invention includes the solar cell module of the present invention.

According to the configuration, the fluorescent substance is dispersed in the at least one fluorescence-dispersed film, and the at least one fluorescence-dispersed film thus containing the fluorescent substance is adhered to the light guide plate. It is therefore unnecessary to prepare a light guide plate in which a fluorescent substance is dispersed. Moreover, the at least one fluorescence-dispersed film can be arbitrarily patterned and/or the fluorescence-dispersed films can be stacked. Since the solar cell element is provided on the surface of the light guide plate which surface is perpendicular to the daylight surface, it is possible to obtain sufficient power generation efficiency while configuring the solar cell module to have a small area.

As such, it is possible to provide the solar cell module which (i) achieves sufficient power generation efficiency, (ii) has a high design freedom, and (iii) can be easily manufactured at low cost. The solar photovoltaic device including the solar cell module, accordingly, can be suitably used as a solar photovoltaic system provided at a window of a building or of an automobile or provided on a roof of a building.

Advantageous Effects of Invention

The solar cell module of the present invention includes a light guide plate; at least one fluorescence-dispersed film in each of which a fluorescent substance is dispersed, the at least one fluorescence-dispersed film being adhered to respective at least one surface of the light guide plate; and a solar cell element which is provided on another surface of the light guide plate, the another surface being perpendicular to the at least one surface. The solar cell module, therefore, (i) has a high design freedom and (ii) can be easily manufactured at low cost.

DESCRIPTION OF EMBODIMENTS

Embodiment 1

(Solar Cell Module 10)

Figure 1:
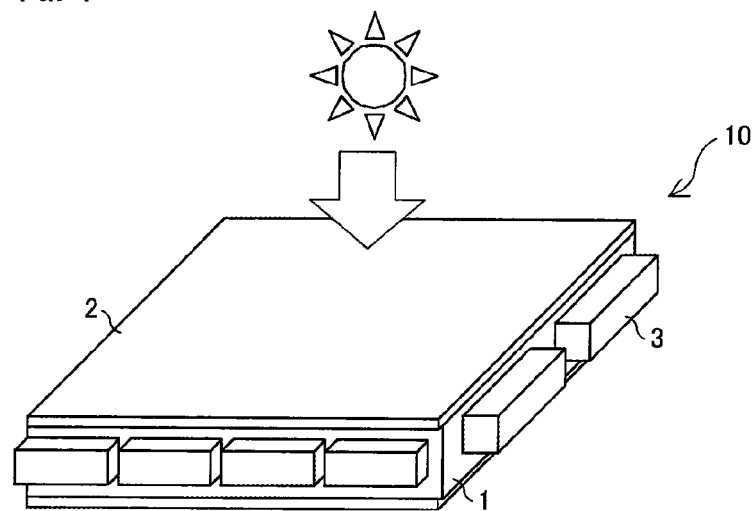
FIG. 1 is a perspective view illustrating a solar cell module in accordance with an embodiment of the present invention.
Figure 2:
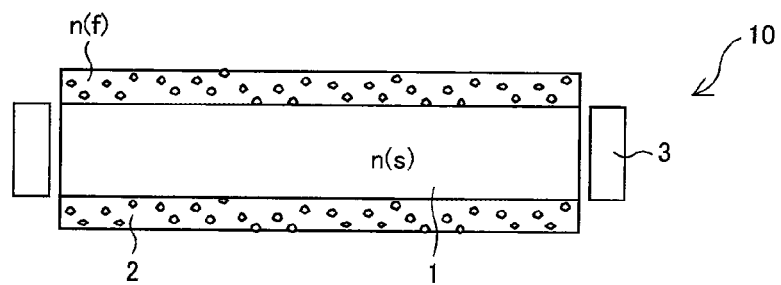
FIG. 2 is a cross-sectional view illustrating a solar cell module in accordance with an embodiment of the present invention.
Figure 3:
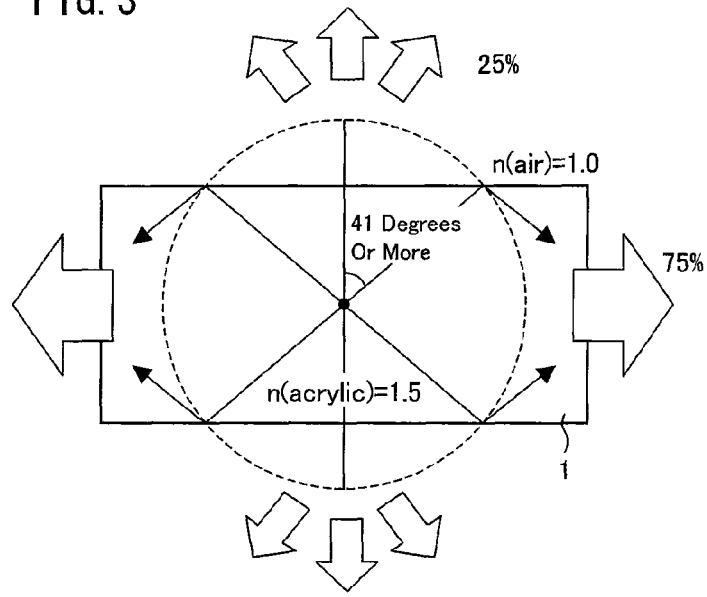
FIG. 3 is a view for explaining how light is guided in a solar cell module in accordance with an embodiment of the present invention.

The following describes a solar cell module in accordance with an embodiment of the present invention, with reference to FIGS. 1 through 3. FIG. 1 is a perspective view illustrating a solar cell module 10. FIG. 2 is a cross-sectional view illustrating the solar cell module 10. FIG. 3 is a view for explaining how light is guided in the solar cell module 10.

The solar cell module 10 includes a light guide plate 1, a fluorescence-dispersed film 2, and solar cell elements 3 (see FIGS. 1 and 2). According to the light guide plate 1, the fluorescence-dispersed film 2 is adhered to an entire daylight surface which sunlight enters. According to the present embodiment, another fluorescence-dispersed film 2 is further adhered to another surface which faces the daylight surface. It follows that the light guide plate 1 is configured to be provided between the two fluorescence-dispersed films 2. Of course, a fluorescence-dispersed film 2 can be merely adhered to the daylight surface. Note, however, that it is preferable to adhere the two fluorescence-dispersed films 2 on the daylight surface and the surface facing the daylight surface, because sunlight conversion efficiency is further improved. According to the light guide plate 1, the solar cell elements 3 are provided on surfaces (edge surfaces) perpendicular to the daylight surface. In the present embodiment, a plurality of solar cell elements 3 are provided on each of four edge surfaces of the light guide plate 1 which edge surfaces are perpendicular to the daylight surface.

The light guide plate 1 is not limited to a particular light guide plate, provided that such a light guide plate diffuses light which has entered through its daylight surface so as to converge the light onto the solar cell elements 3 provided on its edge surfaces. A conventionally known substrate, such as an acrylic substrate, a glass substrate, or a polycarbonate substrate, can be used as the light guide plate 1. Note, however, that the present embodiment is not limited to these. A thickness of the light guide plate 1 is not limited to a particular thickness. It is preferable that the thickness of the light guide plate 1 is equal to or greater than a wavelength of visible light, i.e., 1 μm or more. It is preferable that the thickness of the light guide plate 1 is 10 cm or less, by taking into consideration (i) weight of the light guide plate 1 and (ii) an area of a part on the edge surface with which part a solar cell comes into contact.

The light guide plate 1 guides, in its inside, light which has entered the light guide plate 1. The light guide plate 1 is preferably a transparent plate which does not contain a fluorescent substance. Note, however, that the present embodiment is not limited to this, provided that the light guide plate 1 has been manufactured without being subjected to a dispersion process in which a material such as a fluorescent substance is dispersed in the light guide plate 1 so that a wavelength conversion is made in the light guide plate 1. In other words, it is possible to suitably use even a light guide plate 1, which (i) is not aimed at making a wavelength conversion, (ii) partially contains a fluorescent substance, and (iii) is not completely transparent.

In a case where the solar cell module 10 is used by being provided in a window frame of a building, the light guide plate 1 is configured by a substrate such as an acrylic substrate which has a size and a thickness allowing the light guide plate 1 to be provided in a window frame and to serve as a windowpane. Alternatively, in a case where the solar cell module is used by being provided on a roof, a size and a thickness of the light guide plate 1 can be set as appropriate, in accordance with conditions such as an installation area.

The fluorescence-dispersed film 2 is a film obtained by dispersing a fluorescent substance in a light-transmitting polymer material such as a resin. The fluorescence-dispersed film 2 converts a wavelength of light, which has entered the fluorescence-dispersed film 2, into a wavelength so as to obtain a wavelength range effective in making a photoelectric conversion in the solar cell element 3. It is possible to use, as the fluorescence-dispersed film 2, a conventionally known film made up of a resin in which a fluorescent substance is dispersed. Examples of such a resin encompass an acrylic resin, a polypropylene resin, a cycloolefin resin, a polycarbonate resin, a triacetylcellulose resin, or a PET resin. Note that the present embodiment is not limited to this. It is preferable that the fluorescence-dispersed film 2 has a thickness of 10 μm to 3000 μm, more preferably, 100 μm to 1000 μm. Such a thickness is suitable for providing the fluorescence-dispersed film 2 on the light guide plate 1, and the fluorescence-dispersed film 2 can therefore be easily adhered to the light guide plate 1.

Various kinds of fluorescent substances can be dispersed in the fluorescence-dispersed film 2. It is possible to use, as the fluorescent substances, a rare earth complex such as a [Tb(bpy)2]Cl3 complex; a [Tb(terpy)2]Cl3 complex; an [Eu(phen)2]Cl3 complex; or a sialon fluorescent substance such as Ca-α-SiAlON:Eu. Note, however, that the fluorescent substances are not limited to these. Moreover, examples of the fluorescent substance, which is to be dispersed in the fluorescence-dispersed film 2, encompass a hydrochloride and a sulfate of a rare earth metal such as samarium, terbium, europium, gadolinium, or dysprosium; transition metalate such as calcium molybdate or calcium tungstate; aromatic hydrocarbon such as benzene or naphthalene; or phthalein dye such as eosin or fluorescein.

It is preferable that the fluorescent substance, which is dispersed in the fluorescence-dispersed film 2, has a particle diameter of 5 μm to 10 μm. This allows an efficient fluorescence emission. Moreover, it is preferable that a content of the fluorescent substance dispersed in the fluorescence-dispersed film 2 is 10% by weight or less. This allows a suppression of multiple scattering caused by the fluorescent substance, and therefore an efficient fluorescence emission can be achieved.

According to the solar cell module 10, the light guide plate 1 and the fluorescence-dispersed film 2 are configured so as to satisfy a relation $n(f) \leq n(s)$, where "n(s)" is a refractive index of the light guide plate 1 and "n(f)" is a refractive index of the fluorescence-dispersed film 2. More preferably, the light guide plate 1 and the fluorescence-dispersed film 2 are configured so as to satisfy a relation $n(f) < n(s)$. With the configuration, light, which has entered the fluorescence-dispersed film 2, can be guided in the light guide plate 1 without being subjected to total reflection at an interface between the fluorescence-dispersed film 2 and the light guide plate 1. This allows sunlight, which has entered the solar cell module 10, to be efficiently converged onto the solar cell elements 3.

A known solar cell, such as an amorphous silicon (a-Si) solar cell, a polycrystalline silicon solar cell, or a single crystal silicon solar cell, can be used as the solar cell element 3. However, the solar cell element 3 is not limited to these. The solar cell elements 3 are attached to the edge surfaces perpendicular to the daylight surface, via a conventionally known material or member such as a light-transmitting adhesive agent or a holding member. A size of the solar cell element 3 is not limited to a particular size. Note, however, that a light-receiving part of the solar cell element 3 preferably has a width which is identical with the thickness of the light guide plate 1. With the configuration, the solar cell element 3 can efficiently receive light which has been guided in the light guide plate 1 and arrived at the edge surfaces of the light guide plate 1.

The following describes how the sunlight, which has entered the solar cell module 10, is guided in the light guide plate 1. When light enters a region having a lower refractive index from a region having a higher refractive index, a total reflection phenomenon is caused depending on an entry angle of the light. In a case where first light emitted from the fluorescent substance enters the light guide plate (acrylic substrate) 1, which has, for example, a refractive index of 1.5, at an entry angle between 0 degree to approximately 41 degrees with respect to the surface (whose normal direction is 0 degree) of the light guide plate 1, the first light will be directed outside of the light guide plate 1 (see FIG. 3). On the other hand, second light, which has entered the light guide plate 1 at an angle of approximately 41 degrees or more, is guided in the light guide plate 1 while being repeatedly subjected to total reflection. As compared to the first light, a ratio of the second light is approximately 75%, even in the case where the light guide plate 1 is made of the acrylic substrate having the refractive index of 1.5.

Here, a solar cell module 10 having a configuration illustrated in FIGS. 1 and 2 was prepared, and its power generation efficiency was evaluated. First, a fluorescence-dispersed film 2 (having a thickness of 200 μm) was prepared by dispersing, in an acrylic resin, approximately 5% by weight of a rare earth complex (particles of a complex such as a [Tb(bpy)2]Cl3 complex, a [Tb(terpy)2]Cl3 complex, and an [Eu(phen)2]Cl3 complex; each particle has a size of 5 μm to 10 μm) which produces luminescence in response to ultraviolet light. The fluorescence-dispersed films 2 thus prepared are adhered to both sides of an acrylic substrate (having a thickness of 10 mm, a size of 1 m×1 m) by use of an acrylic adhesive agent. Then, solar cell elements 3, each of which has a light-receiving part having a width of 10 mm, were provided on four edge surfaces of the acrylic substrate. The acrylic materials all had a refractive index of 1.5. The solar cell module 10 thus prepared generated electric power of approximately 500 W when it was irradiated with sunlight. On the other hand, conventional solar cell modules, which were arranged all over a plane, generated electric power of approximately 145 W when they were irradiated with sunlight. Note that the conventional solar cell modules were solar cell modules each generate electric power by being directly irradiated with sunlight, unlike the solar cell module of the present invention which generates electric power by irradiating the solar cell elements with converged light.

According to the solar cell module 10, the fluorescence-dispersed films 2 are thus adhered to the light guide plate 1. It is therefore possible to repair or alter the solar cell module 10 only by replacing the fluorescence-dispersed films 2 with another fluorescence-dispersed film 2. Therefore, the solar cell module 10 of the present embodiment (i) has drastically high design freedom and (ii) can be easily manufactured. Moreover, according to the present embodiment, the fluorescence-dispersed film 2, in which the fluorescent substance is dispersed, is used instead of a conventional light guide plate in which a fluorescent substance is dispersed. Such a fluorescence-dispersed film 2 can be manufactured at lower cost than the conventional light guide plate, and manufacturing cost of the solar cell module 10 can therefore be suppressed. Moreover, according to the present embodiment, the solar cell elements 3 are provided on the edge surfaces perpendicular to the daylight surface of the light guide plate 1. This allows the solar cell module 10 to achieve sufficient power generation efficiency in spite of a small area. It is therefore possible to manufacture the solar cell module 10 at low cost. In addition, the relation between the refractive index of the light guide plate 1 and the refractive index of the fluorescence-dispersed film 2 is controlled in the present embodiment. This allows light, emitted from the fluorescent substance which has been excited by sunlight, to be efficiently guided in the light guide plate 1. The solar cell module 10 of the present embodiment, therefore, can be provided in a window frame of a building or of an automobile or can be provided on a roof. This makes it possible to provide a highly efficient solar photovoltaic system.

(Solar Photovoltaic Device)

A solar photovoltaic device of the present invention includes the solar cell module 10 above described. The solar photovoltaic device of the present invention can include, for example, a plurality of solar cell modules 10 and a storage battery which stores electric power supplied from each of the plurality of solar cell modules 10. The solar photovoltaic device of the present invention includes the solar cell module 10 and is therefore capable of efficiently converting solar energy into electric power at a location such as at a window or a roof of a building or at a window of an automobile.

Embodiment 2

Figure 4:
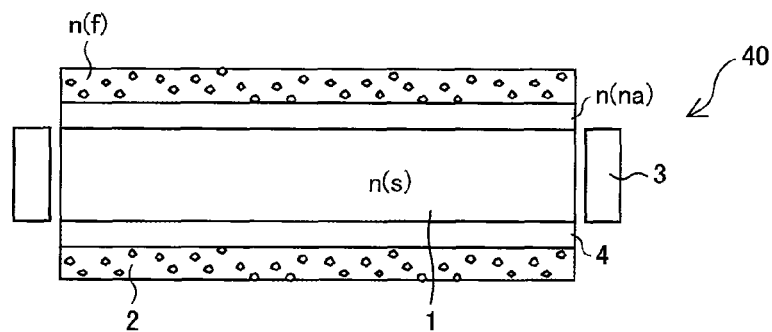
FIG. 4 is a cross-sectional view illustrating a solar cell module in accordance with another embodiment of the present invention.

The following describes a solar cell module in accordance with another embodiment of the present invention, with reference to FIG. 4. A solar cell module 40 of this Embodiment 2 is different from the solar cell module 10 of Embodiment 1 in that the solar cell module 40 further includes an adhesive layer 4 which is provided between a light guide plate 1 and a fluorescence-dispersed film 2 so that the fluorescence-dispersed film 2 is adhered to the light guide plate 1 via the adhesive layer 4 (see FIG. 4). In this Embodiment 2, a description will be merely given to configurations different from those of Embodiment 1, and descriptions regarding the other configurations are omitted.

According to the solar cell module 40, the adhesive layer 4, the light guide plate 1, and the fluorescence-dispersed film 2 are configured so as to satisfy a relation $n(f) \leq n(a) \leq n(s)$, where "n(a)" is a refractive index of the adhesive layer 4, "n(s)" is a refractive index of the light guide plate 1, and "n(f)" is a refractive index of the fluorescence-dispersed film 2. With the configuration, it is possible to prevent sunlight from being reflected by (i) a boundary surface between the fluorescence-dispersed film 2 and the adhesive layer 4 and (ii) a boundary surface between the adhesive layer 4 and the light guide plate 1. This allows the sunlight to be efficiently guided in the light guide plate 1.

The adhesive layer 4 can be formed by (i) applying a conventionally known light-transmitting adhesive agent to the light guide plate 1 or to the fluorescence-dispersed film 2 so as to be stratified and then (ii) adhering the fluorescence-dispersed film 2 to the light guide plate 1 via the light-transmitting adhesive agent. For example, a conventionally known acrylic adhesive agent can be used as the adhesive agent. Note, however, that the adhesive agent is not limited to this. Another adhesive agent, such as an α-olefinic adhesive agent, an urethane resin adhesive agent, an epoxy resin adhesive agent, an ethylene-vinyl acetate resin adhesive agent, or a silicone adhesive agent, can be also suitably used as the adhesive agent.

Here, a solar cell module 40 having a configuration illustrated in FIG. 4 was prepared, and its power generation efficiency was evaluated. First, a fluorescence-dispersed film 2 was prepared by dispersing a fluorescent substance in a polypropylene resin having a refractive index $n(f)=1.49$. Then, adhesive layers 4 were formed by applying an acrylic adhesive agent having a refractive index $n(a)=1.50$ to both sides of a glass substrate (light guide plate 1) having a refractive index $n(s)=1.54$. Subsequently, the fluorescence-dispersed films 2 were adhered to the glass substrate (having a thickness of 5 mm, a size of 1 m×1 m) via the respective adhesive layers 4. Then, solar cell elements 3, each of which had a width of 5 mm, were provided on two side surfaces of the glass substrate to which two side surfaces the fluorescence-dispersed film 2 were not adhered. The solar cell module 40 thus prepared generated electric power of approximately 90 W when the solar cell module 40 was irradiated with sunlight. On the other hand, conventional solar cell modules, which were arranged all over a plane, generated electric power of approximately 35 W when the conventional solar cell modules were irradiated with sunlight.

Embodiment 3

A solar cell module of this Embodiment 3 is different from the solar cell module 40 of Embodiment 2 in that an infrared absorption agent is dispersed in a fluorescence-dispersed film 2. In this Embodiment 3, a description will be merely given to configurations different from those of Embodiment 2, and descriptions regarding the other configurations are omitted.

Aluminum nitride particles can be used as the infrared absorption agent which is to be dispersed in the fluorescence-dispersed film 2 of the solar cell module in accordance with the present embodiment. Note, however, that the infrared absorption agent is not limited to this. The infrared absorption agent, which is dispersed in the fluorescence-dispersed film 2, absorbs infrared light, which has a wavelength falling within a region Y of a solar energy distribution illustrated in a graph of FIG. 6, so as to prevent the infrared light from passing through the fluorescence-dispersed film 2.

It is preferable that the infrared absorption agent has a particle diameter of 1 μm to 100 μm. This allows infrared light to be efficiently absorbed. Moreover, it is preferable that a content of the infrared absorption agent in the fluorescence-dispersed film 2 is 10% by weight or less. This makes it possible to prevent scattering of light in the light guide plate 1.

A solar cell module was prepared in a manner similar to Embodiment 2, except that aluminum nitride particles were dispersed in a fluorescence-dispersed film 2 by 1% by weight. The solar cell module blocked, by approximately 80%, infrared light having a wavelength of approximately 800 μm. As such, in a case where the solar cell module is provided in a window frame so as to be used as a windowpane, (i) photovoltaic power generation can be efficiently carried out and (ii) infrared rays, which increase an indoor temperature, can be effectively blocked.

Note that, according to the present embodiment, the infrared absorption agent is dispersed in the fluorescence-dispersed film 2 so as to block infrared rays passing through the fluorescence-dispersed film 2. Alternatively, a similar effect can be brought about by providing an infrared reflection layer(s) on at least one of surfaces of the fluorescence-dispersed film 2. In such a case, a layer such as a cholesteric liquid crystal layer or a dielectric multilayer film can be used as the infrared reflection layer.

Embodiment 4

Figure 5:
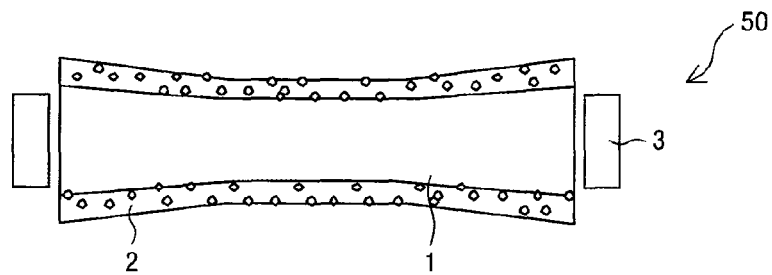
FIG. 5 is a cross-sectional view illustrating a solar cell module in accordance with another embodiment of the present invention.

The following describes a solar cell module in accordance with Embodiment 4 of the present invention, with reference to FIG. 5. A solar cell module 50 of this Embodiment 4 is different from the solar cell module 10 of Embodiment 1 in that a light guide plate 1, to which both sides respective fluorescence-dispersed films 2 are adhered, has a thickness, in its thickness direction, which thickness is thicker in center part than in end parts (see FIG. 5). In this Embodiment 4, a description will be merely given to configurations different from those of Embodiment 1, and descriptions regarding the other configurations are omitted.

According to the solar cell module 50, the light guide plate 1 (a daylight surface and opposed surface) has a shape which is thickened toward the end parts from its center part. The light guide plate 1 has a thickness, in the thickness direction, which thickness is continuously thickened toward the end parts from the center part. The edge parts of the light guide plate 1 are the thickest in the thickness direction. It is therefore possible to easily provide solar cell elements 3 on edge surfaces of the light guide plate 1.

A solar cell module 50 as illustrated in FIG. 5 was prepared for evaluation. First, a fluorescence-dispersed film 2 was prepared by dispersing a fluorescent substance in a cycloolefin polymer resin having a refractive index $n(f)=1.50$. Subsequently, an acrylic adhesive agent having a refractive index $n(a)=1.50$ was applied onto both sides of a polycarbonate substrate (light guide plate 1) having a refractive index $n(s)=1.59$, and then the fluorescence-dispersed films 2 were adhered to the both sides via the acrylic adhesive agent. The polycarbonate substrate (having a size of 1 m×1 m) was configured to (i) have a thickness, in the thickness direction, which thickness is continuously thickened toward the ends from the center part and (ii) have, in the thickness direction, a center thickness of 3 mm and an end thickness of 5 mm. Next, solar cell elements 3, each of which had a width of 5 mm, were provided on all edge surfaces (four edge surfaces) of the polycarbonate substrate to which edge surfaces the fluorescence-dispersed films 2 were not adhered. According to the configuration, the polycarbonate substrate had a thickness which continuously thickened toward the ends from the center part. It was therefore possible to easily provide the solar cell elements 3 on the edge surfaces of the polycarbonate substrate.

Embodiment 5

Figure 6:
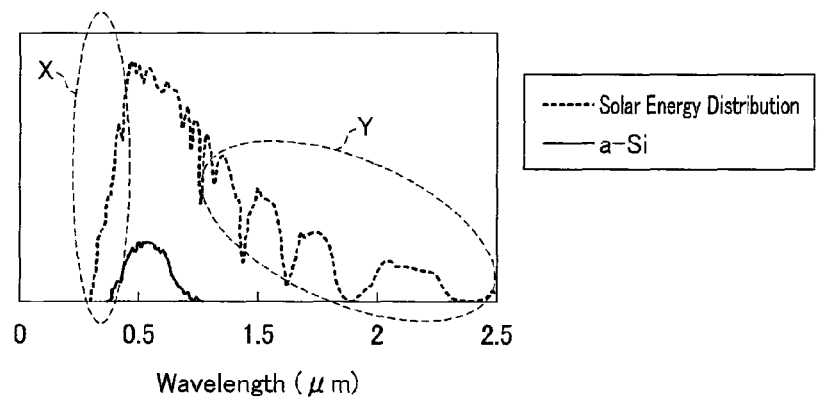
FIG. 6 is a graph illustrating a sensitivity distribution of a solar cell and a solar energy distribution.
Figure 7:
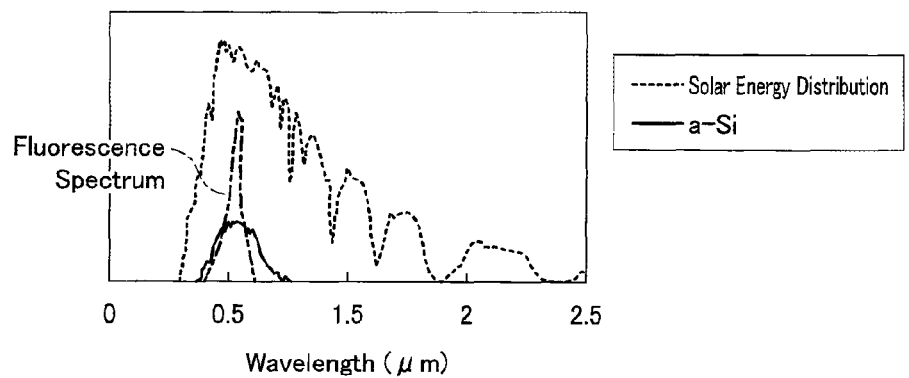
FIG. 7 is a graph illustrating a relation between (i) a fluorescence spectrum of a solar cell module and (ii) a sensitivity distribution of a solar cell and a solar energy distribution, in accordance with an embodiment of the present invention.
Figure 8:
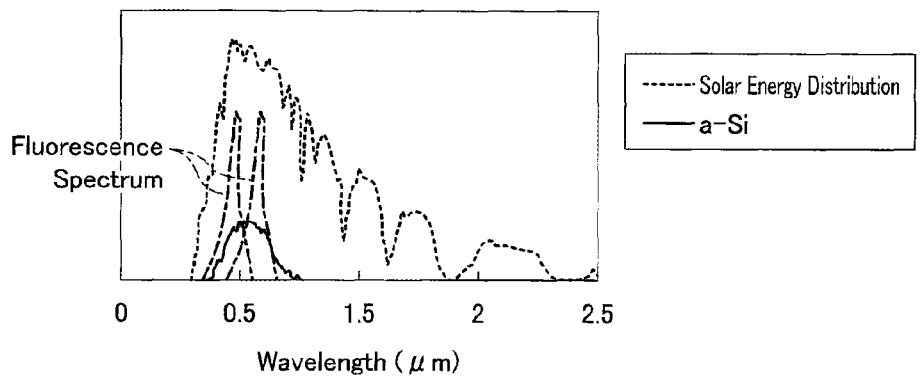
FIG. 8 is a graph illustrating a relation between (i) a fluorescence spectrum of a solar cell module and (ii) a sensitivity distribution of a solar cell and a solar energy distribution, in accordance with an embodiment of the present invention.

The following describes a solar cell module in accordance with Embodiment 5 of the present invention, with reference to FIGS. 6 through 8. FIG. 6 is a graph illustrating a sensitivity distribution of a solar cell and a solar energy distribution. FIG. 7 is a graph illustrating a relation between (i) a fluorescence spectrum of a solar cell module and (ii) a sensitivity distribution of a solar cell and a solar energy distribution, in accordance with an embodiment of the present invention. FIG. 8 is a graph illustrating a relation between (i) a fluorescence spectrum of a solar cell module and (ii) a sensitivity distribution of a solar cell and a solar energy distribution, in accordance with an embodiment of the present invention.

A solar cell module of this Embodiment 5 is different from the solar cell module 10 of Embodiment 1 in that a fluorescent substance, having a maximum fluorescent wavelength substantially identical with a maximum sensitivity wavelength of a solar cell element 3, is contained in a fluorescence-dispersed film 2. In this Embodiment 5, a description will be merely given to configurations different from those of Embodiment 1, and descriptions regarding the other configurations are omitted.

The fluorescent substance, which is contained in the fluorescence-dispersed film 2 of the solar cell module in accordance with the present embodiment, has the maximum fluorescent wavelength substantially identical with the maximum sensitivity wavelength of the solar cell element 3. Here, solar energy is distributed in a wide range of wavelength so as to spread beyond a range of a sensitivity distribution of an amorphous silicon solar cell (a-Si) which is used as the solar cell element 3 (see FIG. 6). In view of the circumstances, a wavelength conversion is carried out, with the use of the fluorescent substance contained in the fluorescence-dispersed film 2, so that the solar energy in a range X (see FIG. 6) is distributed within the range of the sensitivity distribution of the solar cell element 3.

Note that it is preferable that the maximum fluorescent wavelength of the fluorescent substance contained in the fluorescence-dispersed film 2 substantially conforms to the maximum sensitivity wavelength of the solar cell element 3 (see the fluorescence spectrum shown in FIG. 7). This is because such a conformity of the wavelengths allows more efficient photoelectric conversion. According to the present embodiment, since the fluorescent substance, having the maximum fluorescent wavelength substantially identical with the maximum sensitivity wavelength of the solar cell element 3, is contained in the fluorescence-dispersed film 2, it is possible to efficiently convert solar energy into electric energy.

In this specification, the phrase "fluorescent substance having the maximum fluorescent wavelength substantially identical with (or substantially conforms to) the maximum sensitivity wavelength of the solar cell element 3" indicates not only a case where the maximum fluorescent wavelength is completely identical with the maximum sensitivity wavelength, but also a case where (i) the fluorescence spectral distribution of the fluorescent substance and (ii) the sensitivity wavelength distribution of the solar cell element 3 partially overlap each other such that a peak of the fluorescence spectral distribution comes close to a peak of the sensitivity wavelength distribution. As such, it is possible to express as "a peak of the fluorescence spectral distribution is identical with a peak of the sensitivity wavelength distribution" even in a case where (i) the fluorescence spectral distribution of the fluorescent substance and (ii) the sensitivity wavelength distribution of the solar cell element 3 partially overlap each other such that a peak of the fluorescence spectral distribution comes close to a peak of the sensitivity wavelength distribution.

A solar cell module was prepared in a manner similar to Embodiment 1, except that, for example, a sialon fluorescent substance (Ca-$\alpha$-SiAlON:Eu) was contained in a fluorescence-dispersed film 2. First, the fluorescence-dispersed film 2 was prepared by dispersing the sialon fluorescent substance (Ca-$\alpha$-SiAlON:Eu) in an acrylic resin having a refractive index n(f)=1.50. Subsequently, an acrylic adhesive agent having a refractive index n(a)=1.50 was applied to both sides of a polycarbonate substrate (light guide plate 1) having a refractive index n(s)=1.59, and then the fluorescence-dispersed films 2 were adhered to the both sides via the acrylic adhesive agent. The polycarbonate substrate was configured to have a thickness of 5 mm and a plane area size of 1 m×1 m. Further, solar cell elements 3, each of which had a width of 5 mm, were provided on all edge surfaces (four surfaces) of the polycarbonate substrate. An a-Si solar cell was used as each of the solar cell elements. Solar energy could be efficiently converted into electric energy, because the a-Si solar cell had a maximum sensitivity wavelength substantially identical with a maximum fluorescent wavelength of the sialon fluorescent substance (see FIG. 7).

Alternatively, a fluorescence-dispersed film 2 can be prepared by a plurality of stacked films in which fluorescent substances having respective different absorption wavelengths are contained. In each of the plurality of stacked films, a corresponding fluorescent substance having a corresponding maximum fluorescent wavelength substantially identical with the maximum sensitivity wavelength of the solar cell element 3 (see FIG. 8) is contained. This allows various frequency ranges of light to be converted into respective wavelengths falling within a sensitivity range of the solar cell element 3. This ultimately allows an increase in power generation efficiency.

It is possible to use, as the fluorescent substances for adhesion layers which have the respective different absorption wavelengths, Lumogen F Violet 570 (maximum absorption wavelength: 378 nm, maximum emission wavelength: 413 nm), Lumogen F Yellow 083 (maximum absorption wavelength: 476 nm, maximum emission wavelength: 490 nm), Lumogen F Orange 240 (maximum absorption wavelength: 524 nm, maximum emission wavelength: 539 nm), and Lumogen F Red 305 (maximum absorption wavelength: 578 nm, maximum emission wavelength: 613 nm) (all of these are manufactured by BASF) in combination.

Alternatively, it is also possible to convert various frequency ranges of light into respective wavelengths falling within a sensitivity range of the solar cell element 3, by adhering (i) one of two fluorescence-dispersed films 2, in which fluorescent substances having respective different absorption wavelengths are contained, to a daylight surface of the light guide plate 1 and (ii) the other of the two fluorescence-dispersed films 2 to an opposed surface of the light guide plate 1. This allows an increase in power generation efficiency.

Embodiment 6

Figure 9:
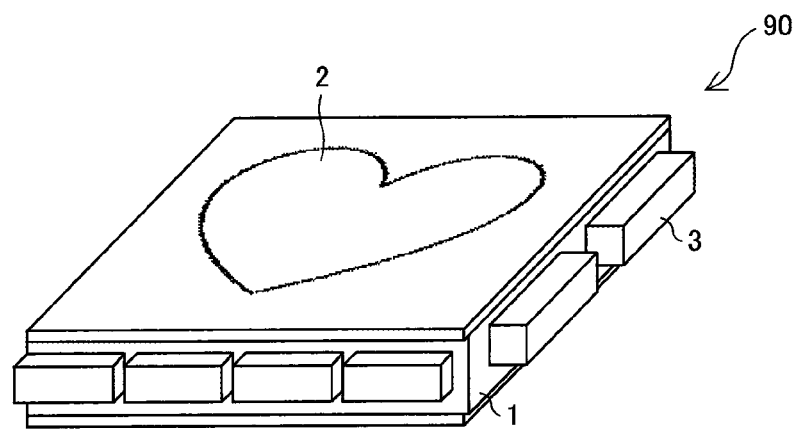
FIG. 9 is a perspective view illustrating a solar cell module in accordance with another embodiment of the present invention.

The following describes a solar cell module in accordance with Embodiment 6 of the present invention, with reference to FIG. 9. FIG. 9 is a perspective view illustrating a solar cell module 90 in accordance with this Embodiment 6 of the present invention. The solar cell module 90 is different from the solar cell module 10 of Embodiment 1 in that a fluorescence-dispersed film 2 is partially provided on a daylight surface of a light guide plate 1. In this Embodiment 6, a description will be merely given to configurations different from those of Embodiment 1, and descriptions regarding the other configurations are omitted.

According to the solar cell module 90, the fluorescence-dispersed film 2 is a heart-shaped film which is adhered to the daylight surface of the light guide plate 1. That is, the fluorescence-dispersed film 2 of the solar cell module 90 is adhered to only part of the daylight surface of the light guide plate 1, instead of being adhered to the entire daylight surface. In a case where the solar cell module 90 is used as, for example, a windowpane, it is possible to improve a design of the windowpane by configuring the fluorescence-dispersed film 2 to have a desired shape. Moreover, since the fluorescence-dispersed film 2 is not adhered to the entire daylight surface of the light guide plate 1, light, which is guided in the light guide plate 1, is less likely to collide with the fluorescent substance, and therefore the light can be efficiently guided. This allows an improvement in power generation efficiency.

A solar cell module 90 as shown in FIG. 9 was prepared as follows. First, a heart-shaped fluorescence-dispersed film 2 was prepared by dispersing a fluorescent substance in a polypropylene resin having a refractive index $n(f)=1.49$. Subsequently, an acrylic adhesive agent having a refractive index $n(a)=1.50$ was applied to a top surface of a glass substrate (light guide plate 1) having a refractive index $n(s)=1.54$, and then the fluorescence-dispersed film 2 was adhered to the top surface of the glass substrate via the acrylic adhesive agent. The glass substrate was configured to have a thickness of 5 mm and a plane area size of 1 m×1 m. Then, solar cell elements 3, each of which had a width of 5 mm, were provided on edge surfaces (four edge surfaces) of the glass substrate which are perpendicular to the surface to which the fluorescence-dispersed film 2 was adhered. According to the solar cell module 90 thus prepared, it was possible to realize a solar photovoltaic system window which excelled in design. Further, it became possible to efficiently generate electric power, based on the fact that, since the fluorescence-dispersed film 2 was not adhered to the entire daylight surface, the light, which was being guided in the glass substrate, was less likely to collide with the fluorescent substance.

The present invention is not limited to the embodiments, but can be altered by a skilled person in the art within the scope of the claims. An embodiment derived from a proper combination of technical means disclosed in respective different embodiments is also encompassed in the technical scope of the present invention.

According to the solar cell module of the present invention, it is preferable that the light guide plate has a refractive index which is equal to or higher than that of the at least one fluorescence-dispersed film. With the configuration, light, which has entered the at least one fluorescence-dispersed film, can be efficiently guided in the light guide plate without being subjected to total reflection by a boundary surface between the at least one fluorescence-dispersed film and the light guide plate. This allows sunlight, which has entered the solar cell module 10, to be efficiently converged onto the solar cell element, and therefore power generation efficiency is improved.

According to the solar cell module of the present invention, it is preferable that the at least one surface is a first surface and a second surface which face each other and to each of which a corresponding fluorescence-dispersed film is adhered. This allows an improvement in sunlight conversion efficiency.

It is preferable that, the solar cell module of the present invention further includes at least one adhesive layer which is provided between the light guide plate and the at least one fluorescence-dispersed film so that the at least one fluorescence-dispersed film is adhered to the light guide plate via the respective at least one adhesive layer, the at least one adhesive layer having a refractive index which (i) is equal to or higher than that of the at least one fluorescence-dispersed film and (ii) is equal to or lower than that of the light guide plate. This makes it possible to (i) sufficiently adhere the at least one fluorescence-dispersed film to the light guide plate, (ii) suppress boundary surface reflection caused by the at least one adhesive layer, and (iii) efficiently guide sunlight in the light guide plate.

According to the solar cell module of the present invention, it is preferable that an infrared absorption agent is further dispersed in the at least one fluorescence-dispersed film. With the configuration, it is possible to block infrared light. Therefore, in a case where the solar cell module is used as a windowpane, (i) photovoltaic power generation can be efficiently carried out and (ii) an increase in indoor temperature can be suppressed.

According to the solar cell module of the present invention, it is preferable that the light guide plate has a thickness, in a direction perpendicular to the at least one surface, which thickness is thickened toward its end parts from its center part. This allows the solar cell element to be easily provided on the light guide plate.

According to the solar cell module of the present invention, it is preferable that the fluorescent substance has a maximum fluorescent wavelength which is substantially identical with a maximum sensitivity wavelength of the solar cell element. This makes it possible to convert a wavelength of light, which wavelength does not fall within the sensitivity range of the solar cell element, into a wavelength falling within the sensitivity range. It is therefore possible to efficiently convert solar energy into electric energy.

According to the solar cell module of the present invention, it is preferable that the at least one fluorescence-dispersed film is made up of a plurality of stacked films in which fluorescent substances having respective different absorption wavelengths are dispersed; and the fluorescent substances which are dispersed in the respective plurality of stacked films have respective maximum fluorescent wavelengths each of which is substantially identical with the maximum sensitivity wavelength of the solar cell element. With the configuration, various frequency ranges of light can be converted into respective wavelengths falling within the sensitivity range of the solar cell element. This ultimately allows an increase in power generation efficiency.

According to the solar cell module of the present invention, it is preferable that the at least one fluorescence-dispersed film is adhered to at least part of the at least one surface.

With the configuration, it is possible to partially provide the at least one fluorescence-dispersed film on the light guide plate by desirably patterning the at least one fluorescence-dispersed film, instead of providing the at least one fluorescence-dispersed film on an entire surface of the light guide plate. This makes it possible to (i) enhance design freedom, (ii) reduce provability of light, which is being guided in the light guide plate, colliding with the fluorescent substance, and (iii) improve power generation efficiency.

INDUSTRIAL APPLICABILITY

The present invention provides a solar cell module which has high design freedom and can easily be manufactured at low cost. Such a solar cell module can be suitably used as a solar photovoltaic system which is provided at a window of a building or of an automobile or is provided on a roof of a building.

REFERENCE SIGNS LIST

1: Light guide plate
2: Fluorescence-dispersed film
3: Solar cell element
4: Adhesive layer
10: Solar cell module

The invention claimed is:

1. A solar cell module comprising:
a light guide plate;
a first fluorescence-dispersed film, the first fluorescence-dispersed film being adhered to only a part of a first surface of the light guide plate and having a two-dimensional shape that has a curve;
a second fluorescence-dispersed film opposed to the first fluorescence-dispersed film via the light guide plate and attached to a second surface of the light guide plate, the second fluorescence-dispersed film having an absorption wavelength that is different from an absorption wavelength of the first fluorescence-dispersed film, the second fluorescence-dispersed film having a two-dimensional shape that has a curve, wherein the light guide plate is between the first fluorescence-dispersed film and the second fluorescence-dispersed film; and
a solar cell element provided on a third surface of the light guide plate, the third surface being perpendicular to either the first or second surface
the first fluorescence-dispersed film and the second fluorescence-dispersed film are adhered to the first and second surfaces, respectively, so that the first fluorescence-dispersed film and the second fluorescence-dispersed film each is spaced, at least in part, from the third surface on which the solar cell element is provided.

2. A solar cell module as set forth in claim 1, further comprising:
at least one adhesive layer which is provided between the light guide plate and the first fluorescence-dispersed film so that the first fluorescence-dispersed film is adhered to the light guide plate via the respective at least one adhesive layer,
the at least one adhesive layer having a refractive index which (i) is higher than that of the first or second fluorescence-dispersed films and (ii) is lower than that of the light guide plate.

3. The solar cell module as set forth in claim 1, wherein:
an infrared absorption agent is further dispersed in the first fluorescence-dispersed film.

4. The solar cell module as set forth in claim 1, wherein:
the light guide plate has a thickness, in a direction perpendicular to the first surface, which thickness is thickened toward its end parts from its center part.

5. The solar cell module as set forth in claim 1, wherein:
a fluorescent substance dispersed in the first or second fluorescence-dispersed film has a maximum fluorescent wavelength which is substantially identical with a maximum sensitivity wavelength of the solar cell element.

6. The solar cell module as set forth in claim 1, wherein:
the first fluorescence-dispersed film is made up of a plurality of stacked films in which fluorescent substances having respective different absorption wavelengths are dispersed; and
the fluorescent substances which are dispersed in the respective plurality of stacked films have respective maximum fluorescent wavelengths each of which is substantially identical with the maximum sensitivity wavelength of the solar cell element.

7. A solar photovoltaic device comprising a solar cell module recited in claim 1.

8. The solar cell module as set forth in claim 1, wherein:
the light guide plate has a refractive index which is equal to or higher than that of the first fluorescence-dispersed film.

9. A solar cell module comprising:
a light guide plate;
at least two fluorescence-dispersed films in each of which a fluorescent substance is dispersed, the films being adhered to only a part of a front outside surface and a back outside surface which are the outermost largest-area surfaces of the light guide plate; and
a solar cell element which is provided on at least a side surface which is perpendicular to the front outside surface and the back outside surface of the light guide plate,
wherein a first fluorescence-dispersed film of the at least two fluorescence-dispersed films has a first fluorescent substance with a first absorption wavelength and is adhered to the front outside surface, and a second fluorescence-dispersed film of the at least two fluorescence-dispersed films has a second fluorescent substance with a second absorption wavelength and is adhered to the back outside surface,
wherein the light guide plate is between the first and the second fluorescence-dispersed films,
wherein each of the fluorescence-dispersed films' edges are spaced from the closest edge of the front outside surface and the back outside surface, respectively, so that a part of the front outside surface and a part of the back outside surface are not covered by the fluorescence-dispersed films,
wherein each of the fluorescence-dispersed films have a two-dimensional shape having a curve.

* * * * *